United States Patent [19]
Mertes et al.

[11] Patent Number: 6,074,798
[45] Date of Patent: Jun. 13, 2000

[54] RADIATION-SENSITIVE MATERIAL CONTAINING A MULTILAYER SUPPORT MATERIAL

[75] Inventors: Jürgen Mertes, Gau-Algesheim; Manfred Michel, Wiesbaden, both of Germany

[73] Assignee: Agfa-Gevaert N.V., Mortsel, Belgium

[21] Appl. No.: 09/196,742

[22] Filed: Nov. 20, 1998

[30] Foreign Application Priority Data

Nov. 27, 1997 [EP] European Pat. Off. ............. 97203740

[51] Int. Cl.$^7$ ................ G03C 11/12; G03F 7/34
[52] U.S. Cl. .................. 430/253; 430/258; 430/259; 430/262; 430/263
[58] Field of Search ................... 430/253, 259, 430/263, 258, 262

[56] References Cited

U.S. PATENT DOCUMENTS

| | | | |
|---|---|---|---|
| 3,210,187 | 10/1965 | Thommes | 430/258 |
| 3,884,693 | 5/1975 | Bauer et al. | 430/259 |
| 4,318,975 | 3/1982 | Kuznetsou et al. | 430/263 |
| 4,544,619 | 10/1985 | Christensen et al. | 430/259 |
| 4,766,053 | 8/1988 | Shinozaki et al. | 430/256 |
| 4,895,787 | 1/1990 | Platzer | 430/253 |
| 4,933,258 | 6/1990 | Shinozaki et al. | 430/260 |
| 5,232,814 | 8/1993 | Graves et al. | 430/259 |
| 5,248,583 | 9/1993 | Lundquist et al. | 430/263 |
| 5,292,613 | 3/1994 | Sato | 430/257 |
| 5,374,184 | 12/1994 | Platzer | 430/262 |
| 5,409,800 | 4/1995 | Sato et al. | 430/263 |
| 5,443,399 | 8/1995 | Maerz et al. | 430/253 |
| 5,492,791 | 2/1996 | Maerz et al. | 430/262 |
| 5,547,811 | 8/1996 | Maerz et al. | 430/257 |
| 5,681,682 | 10/1997 | Maerz et al. | 430/253 |
| 5,683,852 | 11/1997 | Maerz et al. | 430/263 |
| 5,800,962 | 9/1998 | Benzing et al. | 430/259 |

FOREIGN PATENT DOCUMENTS

| | | |
|---|---|---|
| 0 373 438 | 6/1990 | European Pat. Off. . |
| 0 603 642 | 6/1994 | European Pat. Off. . |
| 42 43 912 | 10/1993 | Germany . |

OTHER PUBLICATIONS

European Abstract, Buchmann et al., Pub. No. 6–20499, Pub. date Apr. 1994.
European Abstract, Maerz et al., Pub. No. 5–25624, Pub. date Aug. 1991.

*Primary Examiner*—Richard L. Schilling
*Attorney, Agent, or Firm*—Foley & Lardner

[57] ABSTRACT

The invention relates to a radiation-sensitive material comprising A) a multilayer support material, B) a colored photopolymerizable layer, and C) an adhesive layer. The multilayer support material consists of at least two sheet-form materials, which are bonded to one another in such a way that the adhesion between the two sheet-form materials is less than the adhesion between the radiation-sensitive layer and the adjacent support material. The invention furthermore relates to a process in which a colored image, in particular a multicolored image comprising a plurality of primary-color images, is produced on an image-receiving material. The color images are produced by laminating a colored photopolymerizable layer onto the image-receiving material, exposing the material under the relevant master, in particular a color separation, developing the image by peeling-off the support film from the photopolymerizable layer together with the non-image areas, and, if desired, repeating the same steps with a photopolymerizable layer in a different color.

12 Claims, No Drawings

RADIATION-SENSITIVE MATERIAL CONTAINING A MULTILAYER SUPPORT MATERIAL

TECHNICAL FIELD OF THE INVENTION

The invention relates to a colour proofing method in printing preparation, and to a radiation-sensitive material provided for this purpose.

PRIOR ART

U.S. Pat. No. 4,895,787 discloses a colour proofing method and a material provided for this purpose. This material consists of a transparent support film, whose surface has preferably been pretreated with an adhesion promoter, a photopolymerizable layer, which contains a dye or pigment in a primary colour of multicolour printing, and a heat-activatable adhesive layer on the photopolymerizable layer. After lamination onto an image-receiving material and exposure through the support film, the material is developed by peeling apart the support film and the image-receiving material, with the exposed areas of the photosensitive coloured layer remaining on the support film and the unexposed areas together with the entire adhesion layer remaining on the image-receiving material. The method is positive-working, i.e. a positive reproduction of the master is formed on the receiving material.

This processing method has the great advantage that development requires no alkaline or acidic solutions or organic solvents, which therefore do not need to be disposed of.

A known disadvantage of the method described is that the photosensitive material is exposed through relatively thick polyester films. Exposure through such a thick film causes a significant drop in dot sharpness and thus in resolution.

The object of the invention was to provide a material of the type described at the outset which has improved resolution while at the same time ensuring practical handling.

SUMMARY OF THE INVENTION

The invention relates to a radiation-sensitive material having

A) a flexible laminate of two or more sheet-form materials, of which at least one is transparent to radiation, B) a coloured photopolymerizable layer which comprises
 B1) a polymeric binder,
 B2) a free-radical-polymerizable compound,
 B3) a compound or combination of compounds which is capable of initiating polymerization of B2 on exposure to actinic light, and
 B4) a dye or coloured pigment, and C) a heat-activatable adhesive layer on the photopolymerizable layer, where the adhesion between the two sheet-form materials is less than the adhesion between the radiation-sensitive layer and the adjacent sheet-form material.

DETAILED DESCRIPTION OF THE INVENTION

The novel material is characterized in that the flexible laminate is a material which consists of at least two identical or different materials of which at least the one adjacent to the photopolymer layer must be radiation-transparent. The flexible laminate can consist, for example, of a thin polyester film onto which a second sheet-form material, for example made of polyester, paper or aluminium, has been laminated.

The laminate is characterized in that the thin, radiation-transparent film is between 10 and 35 $\mu$m thick, and the further laminated materials increase the rigidity and handling properties of the film material in such a way that fault-free processing is possible without technical aids.

In another aspect of the invention, a method for the production of a colour image is proposed which is characterized in that a photopolymerizable material of the nature described above is laminated with its adhesive layer onto an image-receiving material under pressure and with heating, separated in such a way that only the thin, radiation-transparent film is still on the photopolymer layer, and exposed imagewise, and the radiation-transparent film is peeled off from the image-receiving material together with the exposed non-image areas.

This structure enables the imagewise exposure to be carried out through very thin materials, thus reducing, for example, scattering effects within the film during the exposure process. The fine elements are retained for longer, and the optimum peel angle of 180° is easier to maintain. This structure also enables the rigidity and handling properties of such radiation-sensitive materials to be significantly improved through the choice of a second or third material.

U.S. Pat. No. 4,895,787 describes photosensitive materials which use a polyester film with a thickness of 50 $\mu$m as support material and which are exposed imagewise through this film and developed by peeling off the support film. The maximum achievable resolution here is 3–98% (60 lines/cm).

The support materials in the novel material consist of a laminate of various materials laminated or bonded together. The material directly adjacent to the photopolymer layer is transparent to light, and the laminate can be separated before exposure between the film adjacent to the photopolymer layer and the remaining materials. The adhesion between the two sheet-form materials can be achieved, for example, by corona treatment or by using a contact adhesive. The strength of the effective adhesion between the sheet-form materials can be effected mostly by choosing a suitable contact adhesive and by bonding the two materials using spots of adhesive or layers of adhesive. The thin films adjacent to the radiation-sensitive layer are particularly preferably materials made, for example, of polyester, polycarbonate, etc. Particular preference is given to films, in particular biaxially stretched and thermoset films, made, for example, of polyethylene terephthalate. The laminate should be dimensionally stable at the requisite lamination temperatures, i.e. from about 60 to 150° C. The overall thickness of the laminate is generally 40 to 250 $\mu$m, preferably from 50 to 100 $\mu$m. The film adjacent to the photopolymer layer is advantageously pretreated with an adhesion promoter on one or both sides and can have a smooth or rough (matt) surface, preferably a smooth surface. In order to facilitate peeling-apart of the support material and the underlying radiation-transparent material, a release layer of, for example, a silicone-containing binder can be applied to the reverse of the radiation-transparent material.

In principle, the novel film laminate is suitable for improving the resolution of radiation-sensitive systems exposed through a film.

The essential constituents of the photopolymerizable layer in the novel material are a polymeric binder, a free-radical-polymerizable compound, a compound which forms free radicals on exposure to actinic light and thus initiates polymerization of the polymerizable compound, and a dye or coloured pigment, preferably in a primary colour of multicolour printing. Examples of photopolymerizable layers having this composition are described in U.S. Pat. No. 4,895,787, which is incorporated herein by way of reference.

The polymeric binder is intended to give the layer homogeneity and strength. Suitable binders are styrene-maleic anhydride and styrene-maleic monoester copolymers, acrylate polymers and copolymers, polyamides, polyvinylpyrrolidones, cellulose derivatives, such as cellulose esters and ethers, phenolic resins, polyvinyl esters, polyvinyl acetals, for example polyvinylbutyral, -propional and -formal. The proportion of binder is generally from 15 to 70% by weight, preferably from 20 to 50% by weight, based on the weight of the solid layer.

The polymerizable compound contains at least one, preferably at least two, terminal, free-radical-polymerizable double bonds and is not gaseous at atmospheric pressure and temperatures below 100° C. Preference is given to esters and amides of acrylic and methacrylic acid. Particular preference is given to esters with polyhydric alcohols. Examples are di-, tri-, tetra- and polyethylene glycol di(meth)acrylate, the di(meth)acrylates of oligo- and polypropylene glycols, 1,4-butanediol di(meth)acrylate, the di- and tri(meth)acrylates of trimethylolpropane and trimethylolethane, pentaerythritol tri- and -tetraacrylate or -methacrylate, dipentaerythritol tetra-, penta- and hexa(meth)acrylate. The proportion of polymerizable compound is generally from 15 to 70% by weight, preferably from 20 to 60% by weight.

Suitable photoinitiators are essentially all compounds or compound combinations known for this purpose. Examples are benzoin ethers, benzil ketals, polycyclic quinones, benzophenone derivatives, triarylimidazolyl dimers, photosensitive trihalomethyl compounds, for example trichloromethyl-s-triazines. Particular preference is given to 2-aryl-4,6-bistrichloromethyl-s-triazines. The amount of photoinitiator or photoinitiator combination is generally from 1 to 25% by weight, preferably from 5 to 15% by weight.

In the preferred application of the novel material for colour proofing in multicolour printing, the dyes or coloured pigments are selected so that they correspond to the primary colours of multicolour printing, namely cyan, magenta, yellow and black. Pigments are generally preferred. Examples are Permanent Yellow G (C.I. 21 095), Permanent Yellow GR (C.I. 21 100), Permanent Yellow DHG (C.I. 21 090), Permanent Ruby L3B (C.I. 15 850 : 1), Permanent Pink F3B (C.I. 12 433), ®Hostaperm Pink E (C.I. 73 915), ®Hostaperm Red Violet ER (C.I. 46 500), Permanent Carmine FBB (C.I. 12 485), ®Hostaperm Blue B2G (C.I. 74 160), ®Hostaperm Blue A2R (C.I. 74 160) and ®Printex 25 (carbon black). If necessary, the pigments can be blended in order to achieve the desired hue. The inorganic or organic pigments are generally dispersed or suspended in a suitable solvent together with some of the binder. The mean particle size is generally less than 1 µm.

The proportion of the dye or pigment is generally from 8 to 40% by weight, preferably from 12 to 30% by weight.

The photopolymerizable layer may, if desired, contain further constituents, such as hydrogen donors, polymerization inhibitors, plasticizers, residual solvents, surfactants, surface levellers, lubricants, antistatics, inert fillers, optical brighteners and/or UV absorbers. It generally has a unit weight of from 0.2 to 5 g/m$^2$, preferably from 0.3 to 3 g/m$^2$.

After the photopolymerizable layer has been dried, a heat-activatable, thermoplastic adhesive layer is applied thereto. This can either be applied directly from a solvent or solvent mixture which does not dissolve the photopolymerizable layer, and then dried, or it can first be applied to a temporary support film and transferred therefrom to the photopolymerizable layer by lamination and the support film can then be peeled off. In another embodiment, the adhesive layer can be obtained by coating the image-receiving material from a solvent and then drying the material. The photopolymerizable layer is then transferred to the resultant adhesive layer by lamination. Direct application to the photopolymerizable layer from solvents is preferred. Suitable solvents which do not dissolve this layer are water and saturated hydrocarbons. Many polymers can be applied from aqueous dispersions; however, application from solution is preferred. Suitable for this purpose are, for example, salts of polymers containing acid groups, for example carboxyl groups. A preferred example is an aqueous-alkaline solution of a vinyl acetate-crotonic acid copolymer (Mowilith® CT 5). Other suitable polymers are polyvinyl acetate or polyacrylate dispersions. The polymer should have a softening point in the range from 40 to 200° C., preferably from 60 to 120° C. In addition to the thermoplastic polymer, the adhesive layer can also contain vinyl ether polymers, plasticizers, residual solvents, surface levellers, surfactants, lubricants, antistatics, inert fillers, optical brighteners and/or UV absorbers. Its weight per unit area in the dry state is normally from 2 to 30 g/m$^2$, preferably from 4 to 15 g/m$^2$. Suitable adhesive layers are also described in U.S. Pat. No. 4,895,787 and EP-A 525 624.

In order to carry out the novel process, the photosensitive material described above is laminated with the adhesive layer onto an image-receiving material. This can consist of plastic, plastic-coated special paper or normal printing paper. Other white or, if desired, non-white receiving materials can likewise be used. A printing paper which is dimensionally stable under the lamination conditions is usually preferred, since it allows a visual impression to be achieved which is very similar to the later print. The lamination is advantageously carried out under pressure and elevated temperature in an apparatus provided for this purpose. The lamination temperature is usually in the range from 60 to 130° C., preferably from 70 to 100° C. After lamination, the novel laminate is first separated by peeling off the upper support material, and the photopolymerizable layer is then exposed in a known manner through the thin, UV-transparent film, generally in contact under a positive colour separation. After the exposure, the film is peeled off manually or in a suitable device. The peel angle should be at least 90°, although an angle of 180° is particularly preferred. The exposed areas of the photopolymerizable layer are removed together with the film, while the unexposed areas remain on the image-receiving material together with the entire adhesive layer. In this way, a positive primary-colour image is obtained. Each further colour proofing film is laminated onto the preceding primary-colour image in the manner described, exposed thereon in register and developed by peeling-off the film. Thus, a complete multicolour image which corresponds to the later 4-colour print is obtained from the primary-colour images in cyan, magenta, yellow and black. If necessary, it is of course also possible to use films in special colours.

The finished multicolour image has a glossy surface. If desired, a matt finish can be obtained, for example by laminating a film having a rough surface onto the glossy surface and peeling it off again. The surface of the finished proof can be protected against scratching or adhesion at elevated temperatures by means of a protective layer.

The invention is illustrated by means of the examples below. All percentages and mixing ratios are given in units by weight.

EXAMPLES

Example 1

The following solutions were applied to a laminate consisting of a polyester film with a thickness of 19 μm which has been provided with adhesion promoter on both sides, and a smooth-coated paper with a thickness of 80 μm:

|  | Cyan | Magenta | Yellow | Black |
|---|---|---|---|---|
| Dipentaerythritol pentaacrylate | 19.9 | 25.0 | 21.6 | 19.9 |
| 2,3-Bis(4-methoxyphenyl)quinoxaline | 5.1 | 6.1 | 5.4 | 5.3 |
| Polyvinylformal (® Formvar 12/85) | 16.3 | 23.0 | 18.4 | 14.2 |
| Edaplan LA 411 (polyether-modified polysiloxane) | 0.2 | 0.2 | 0.2 | 0.2 |
| ® Hostaperm Blue B2G (C.I. 74 160) | 9.7 | | | |
| Permanent Red FBB (C.I. 12 485) | | 12.9 | | |
| Permanent Yellow GR (C.I. 21 100) | | | 8.6 | |
| Carbon black (® Printex 25) | | | | 13.6 |
| Tetrahydrofuran | 398.6 | 363.9 | 382.4 | 378.8 |
| 4-Hydroxy-4-methyl-2-pentanone | 113.9 | 121.3 | 124.3 | 123.1 |
| 1-Methoxy-2-propanol | 360.6 | 326.5 | 353.7 | 331.5 |
| Gamma-butyrolactone | 75.9 | 121.3 | 86.0 | 113.6 |

The pigments were dispersed with part of the binder and part of the butyrolactone. The mean particle size was less than 200 nm.

The coated films were dried at temperatures of up to 110° C. in a drying tunnel. The weight per unit area was between 0.6 and 0.8 g/m².

The optical densities of the individual layers have the following values:

Cyan 1.5
Magenta 1.4
Yellow 1.3
Black 1.9

The following adhesive-layer solution was applied to the dry photopolymerizable layer:

| Vinyl acetate-crotonic acid copolymer 95:5 | 50.0 parts by weight |
|---|---|
| Water | 252 parts by weight |
| Ethanol | 24.0 parts by weight |
| Ammonia water, 25% | 5.0 parts by weight |

The coated films were dried at temperatures of 100° C. in a drying tunnel. The weight per unit area is 6 g/m².

Of the materials produced in this way, the cyan film, as an example, is laminated onto plastic-coated special paper at 120° C. The paper with a thickness of 80 μm is subsequently removed and exposure is carried out through the uncovered PET film, under the cyan separation film, for 30 seconds using a Gallium-doped mercury lamp at a distance of 50 cm. After the exposure, the cyan image is developed by peeling-off the PET support film. These steps are repeated correspondingly with the magenta, yellow and black films.

The dot reproduction is at least 1 to 99% in a 60 lines/cm screen.

Examples 2 to 5

Coloured films are produced as described in Example 1, but using different support materials. The table below shows the different support materials and the achievable dot reproductions.

| Example | Support material | Resolution |
|---|---|---|
| 2 | 12 μm PET/50 μm paper | 1 to 99%, 60 lines/cm screen |
| 3 | 12 μm PET/40 μm paper | 1 to 99%, 60 lines/cm screen |
| 4 | 19 μm PET/50 μm PET | 2 to 99%, 60 lines/cm screen |
| 5 | 12 μm PET/50 μm PP | 2 to 99%, 60 lines/cm screen |
| Comparative Example EP 0 620 499 | 50 μm PET | 3 to 98%, 60 lines/cm screen |

What is claimed is:

1. Radiation-sensitive material comprising:
   A) a flexible laminate of two or more sheet-form materials, of which at least one is transparent to radiation,
   B) a coloured photopolymerizable layer which comprises
      B1) a polymeric binder,
      B2) a free-radical-polymerizable compound,
      B3) a compound or combination of compounds which is capable of initiating polymerization of B2 on exposure to actinic light, and
      B4) a dye or coloured pigment, and
   C) a heat-activatable adhesive layer on the photopolymerizable layer, wherein the adhesion between the two sheet-form materials is less than the adhesion between the photopolymerizable layer and the adjacent sheet-form material; and
   wherein the sheet-form material adjacent to the photopolymerizable layer is transparent and has a thickness of from 10 to 35 μm.

2. Radiation-sensitive material according to claim 1, wherein the sheet-form materials consist of at least one plastic material and a second plastic material, paper or aluminium.

3. Radiation-sensitive material according to claim 1, wherein the total thickness is at least 50 μm.

4. Radiation-sensitive material according to claim 1, wherein the sheet-form material adjacent to the photopolymerizable layer is transparent to wavelengths of from 250 to 1200 nm.

5. Radiation-sensitive material according to claim 4, wherein the radiation-transparent sheet-form material is provided with an adhesion promoter on the surface adjacent to the photopolymerizable layer.

6. Radiation-sensitive material according to claim 4, wherein the radiation-transparent material is provided with a lubricant on the surface facing away from the photopolymer layer.

7. Radiation-sensitive material according to claim 4, wherein the sheet-form material adjacent to the photopolymerizable layer consists of polyethylene terephthalate.

8. Process for the production of a multicolour image, wherein a radiation-sensitive material having the composition indicated in claim 1 is laminated by means of the adhesive layer, under pressure and at elevated temperature, onto an image-receiving material, a first support material is peeled off and then exposure is carried out imagewise through a thin, radiation-transparent film under a colour separation, the radiation-transparent film together with the exposed non-image areas is peeled off from the image-receiving material, the steps comprising lamination, peeling-off of the first support material, exposure and peeling-off of the radiation-transparent film are repeated with at least one further colour separation, where the exposure is carried out in register with the first primary-colour image produced on the image-receiving material.

9. A process for producing an image on an image-receiving material, comprising:

separating a second support layer from a first radiation-transparent support layer of a radiation-sensitive material which comprises the first radiation-transparent support layer, a photopolymerizable layer over the first radiation-transparent support layer, a heat-activatable adhesive layer over the photopolymerizable layer and the image-receiving material over the heat-activatable adhesive layer;

imagewise exposing the photopolymerizable layer to radiation through the first radiation-transparent support layer; and peeling off the first radiation-transparent support layer to separate the exposed regions of the photopolymerizable layer from the unexposed regions of the photopolymerizable layer; and wherein the photopolymerizable layer is a coloured photopolymerizable layer which comprises:
B1) a polymeric binder,
B2) a free-radical-polymerizable compound,
B3) a compound or combination of compounds which is capable of initiating polymerization of B2 on exposure to actinic light, and
B4) a dye or coloured pigment.

10. The process of claim 9, wherein the first radiation-transparent support layer has a thickness of from 10 to 35 μm.

11. The process of claim 10, wherein the radiation-sensitive material is formed by the steps of:

forming the first radiation-transparent support layer over the second support layer;

forming the photopolymerizable layer over the first radiation-transparent support layer;

forming the heat-activatable adhesive layer over the photopolymerizable layer;

forming the image-receiving material over the adhesive layer and the photopolymerizable layer; and peeling off the second support layer from the first radiation-transparent support layer.

12. The process of claim 11, wherein:

the first radiation-transparent support layer is transparent to wavelengths of from 250 to 1200 nm;

the radiation comprises ultraviolet radiation; and the image comprises the unexposed areas of the photopolymerizable layer.

* * * * *